(12) United States Patent
Park (10) Patent No.: US 9,099,415 B2
(45) Date of Patent: Aug. 4, 2015

(54) ORGANIC LIGHT-EMITTING DISPLAY DEVICE

(75) Inventor: Yong-Woo Park, Yongin (KR)

(73) Assignee: SAMSUNG DISPLAY CO., LTD., Yongin, Gyeonggi-Do (KR)

(*) Notice: Subject to any disclaimer, the term of this patent is extended or adjusted under 35 U.S.C. 154(b) by 93 days.

(21) Appl. No.: 13/602,382

(22) Filed: Sep. 4, 2012

(65) Prior Publication Data

US 2013/0228786 A1    Sep. 5, 2013

(30) Foreign Application Priority Data

Mar. 2, 2012    (KR) .................. 10-2012-0022032

(51) Int. Cl.
*H01L 27/32*    (2006.01)
*H01L 51/52*    (2006.01)

(52) U.S. Cl.
CPC ........ *H01L 27/3246* (2013.01); *H01L 51/5268* (2013.01); *H01L 27/3248* (2013.01)

(58) Field of Classification Search
CPC ............ H01L 51/5203; H01L 27/5268; H01L 27/14627; H01L 51/52–51/5268; H01L 27/3246
USPC .......................................................... 257/40
See application file for complete search history.

(56) References Cited

U.S. PATENT DOCUMENTS

| | | | |
|---|---|---|---|
| 7,572,878 B2* | 8/2009 | Ding et al. ................... 528/340 |
| 7,602,118 B2* | 10/2009 | Cok et al. ....................... 313/506 |
| 2005/0023967 A1 | 2/2005 | Gotoh et al. | |
| 2006/0023127 A1 | 2/2006 | Peeters et al. | |
| 2006/0125387 A1* | 6/2006 | Adachi et al. ................. 313/506 |
| 2006/0290253 A1* | 12/2006 | Yeo et al. ....................... 313/116 |
| 2008/0187651 A1* | 8/2008 | Lee et al. ......................... 427/77 |
| 2010/0010160 A1* | 1/2010 | Han et al. ......................... 525/87 |
| 2010/0033078 A1* | 2/2010 | Lee et al. ....................... 313/498 |
| 2010/0038635 A1* | 2/2010 | Tanaka et al. .................... 257/40 |
| 2010/0159576 A1 | 6/2010 | Song et al. | |
| 2010/0193790 A1* | 8/2010 | Yeo et al. ......................... 257/59 |
| 2011/0108877 A1* | 5/2011 | Yamada et al. ................. 257/99 |
| 2011/0266577 A1 | 11/2011 | Kim et al. | |

FOREIGN PATENT DOCUMENTS

| | | |
|---|---|---|
| KR | 10-2004-0076939 A | 9/2004 |
| KR | 10-2005-0013918 A | 2/2005 |
| KR | 10-2005-0016975 A | 2/2005 |
| KR | 10-2010-0072528 A | 7/2010 |
| KR | 10-2010-0078354 A | 7/2010 |

OTHER PUBLICATIONS

Madigan, C. F., et al., "Improvement of output coupling efficiency of organic light-emitting diodes by backside substrate modification," *Applied Physics Letters*, vol. 76, No. 13, Mar. 27, 2000, pp. 1650-1652.

* cited by examiner

*Primary Examiner* — Julia Slutsker
*Assistant Examiner* — Natalia Gondarenko
(74) *Attorney, Agent, or Firm* — Lee & Morse, P.C.

(57) ABSTRACT

An organic light-emitting display device including a thin film transistor (TFT) on a substrate; an organic light emitting diode (OLED) electrically connected to the TFT, the OLED including a pixel electrode, an organic layer, and an opposite electrode; a pixel defining layer (PDL) on the pixel electrode, the PDL including an opening that exposes at least one portion of the pixel electrode; and a light scattering layer between the pixel electrode and the organic layer.

17 Claims, 6 Drawing Sheets

ORGANIC LIGHT-EMITTING DISPLAY DEVICE

BACKGROUND

1. Field of the Invention

Embodiments relate to an organic light-emitting display device, and more particularly, to an organic light-emitting display device having an improved outdoor visibility and luminescent efficiency, and a method of manufacturing the organic light-emitting display device.

2. Description of the Related Art

An organic light-emitting display device is an active matrix type display device having a wide viewing angle, high contrast, and quick response time. Accordingly, the organic light-emitting display device may be applied to mobile display devices including a digital camera, a video camera, a camcorder, a portable information terminal, a smart phone, an ultra-slim notebook, a tablet personal computer, and a flexible display device, or to electronic/electric products such as an ultra-slim television.

The organic light-emitting display device may realize colors via a process in which a hole and an electron that are inserted into an anode and a cathode are recombined in an emission layer (EML) and emit light. In this regard, when an exciton (that is the combination of the inserted hole and electron) returns from an excited state to a ground state, light emission occurs. The organic light-emitting display device has a stack structure in which the EML is inserted between the anode and the cathode.

SUMMARY

Embodiments are directed to an organic light-emitting display device.

According to an embodiment, there is provided an organic light-emitting display device including a thin film transistor (TFT) formed on a substrate; an organic light emitting diode (OLED) electrically connected to the TFT, and comprising a pixel electrode, an organic layer, and an opposite electrode; and a pixel defining layer (PDL) comprising an opening to expose at least one portion of the pixel electrode, and covering the pixel electrode, wherein a light scattering layer is formed between the pixel electrode and the organic layer.

The light scattering layer may include particles that correspond to a residual layer of the PDL formed on a surface of the pixel electrode, and a conductive layer that covers the particles.

The conductive layer may have unevenness.

Protrusions having a bulged micro-lens shape may be formed on a surface of the conductive layer while the protrusions vertically correspond to the particles.

The conductive layer may be formed of a metal nano ink.

The conductive layer may be formed to cover the particles by using a coating method or a printing method.

A plasma treatment, an ultraviolet treatment, or an ozone treatment may be performed on the surface of the pixel electrode on which the particles are arrayed.

The light scattering layer may include particles that correspond to a residual layer of the PDL formed on a surface of the pixel electrode, wherein the particles have unevenness formed via a graft polymerization.

The particles may be covered by a planarization layer.

The light scattering layer may include particles that correspond to a residual layer of the PDL formed on a surface of the pixel electrode, wherein the particles have unevenness formed by graft-polymerizing an intermediate layer.

A surface treatment may be performed on the pixel electrode on which the particles are arrayed.

The intermediate layer may include a polyimide component obtained by polymerizing polyamic acid.

The TFT may include a semiconductor active layer, a gate electrode, source and drain electrodes, and a plurality of insulating layers interposed therebetween, and, the pixel electrode may be electrically connected to one of the source and drain electrodes.

The pixel electrode may include a first electrode that includes a transparent conductive material, and a second electrode that is formed on the first electrode and includes a metal material.

The first conductive layer may include at least one material selected from the group of indium tin oxide (ITO), indium zinc oxide (IZO), zinc oxide (ZnO), indium oxide ($In_2O_3$), indium gallium oxide (IGO), and aluminum zinc oxide (AZO).

The first conductive layer may be externally exposed via the opening of the PDL, and the light scattering layer and the organic layer may be stacked on the first conductive layer.

BRIEF DESCRIPTION OF THE DRAWINGS

Features will become apparent to those of ordinary skill in the art by describing in detail exemplary embodiments with reference to the attached drawings in which.

DETAILED DESCRIPTION

Korean Patent Application No. 10-2012-0022032, filed on Mar. 2, 2012, in the Korean Intellectual Property Office, and entitled, "Organic Light-Emitting Display Device," is incorporated by reference herein in its entirety.

Particular embodiments will be illustrated in the drawings and described in detail in the written description. However, this is not intended to limit the embodiments to particular modes of practice, and it is to be appreciated that all changes, equivalents, and substitutes that do not depart from the spirit and technical scope of the embodiments are encompassed in the embodiments. In the description of the embodiments, certain detailed explanations of related art are omitted when it is deemed that they may unnecessarily obscure the essence of the invention.

While such terms as "first," "second," etc., may be used to describe various components, such components must not be limited to the above terms. The above terms are used only to distinguish one component from another.

The terms used in the present specification are merely used to describe particular embodiments, and are not intended to limit the embodiments. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

An organic light-emitting display device according to an embodiment will be described below in more detail with reference to the accompanying drawings. Those components that are the same or are in correspondence are rendered the same reference numeral regardless of the figure number, and redundant explanations may be omitted.

Figure 1:
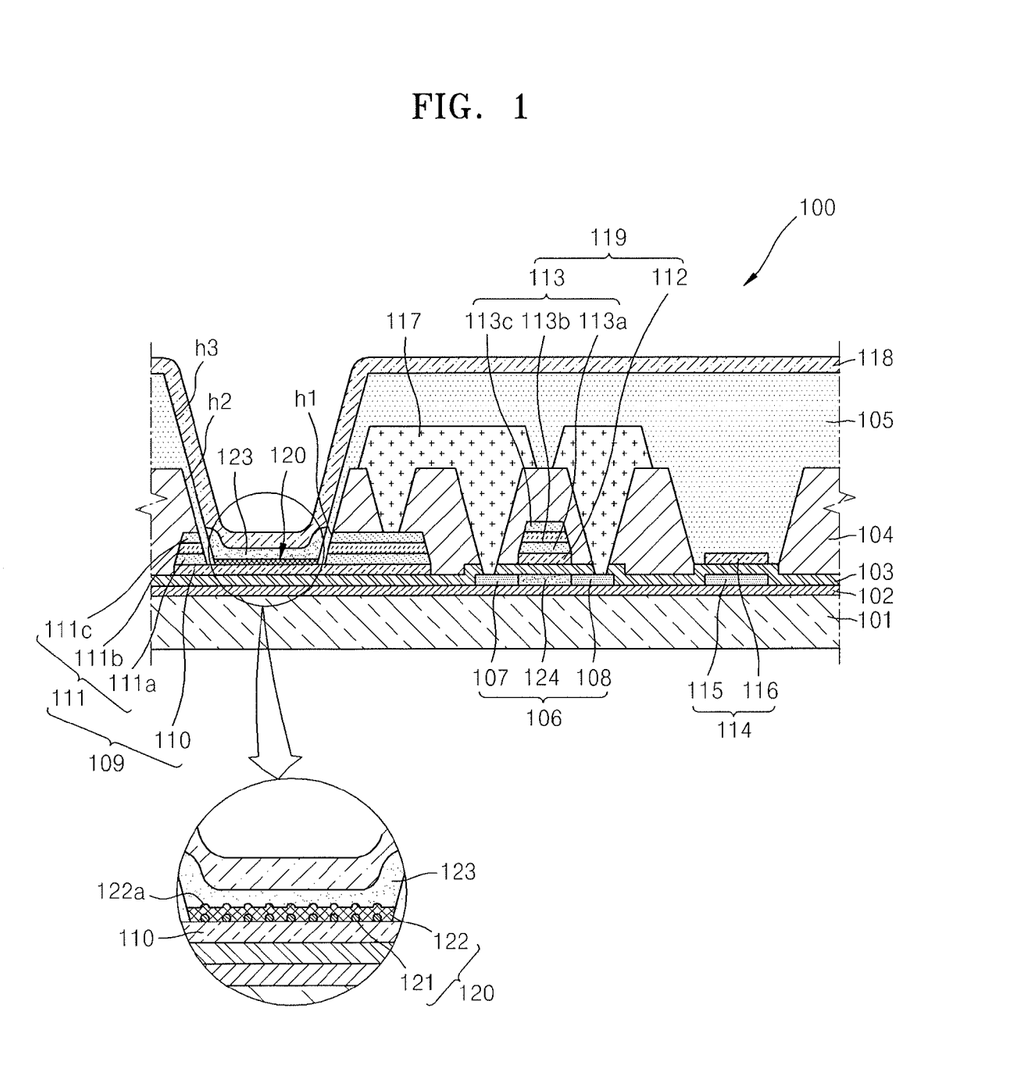
FIG. 1 illustrates a cross-sectional view of an organic light-emitting display device according to an embodiment.
Figure 2:
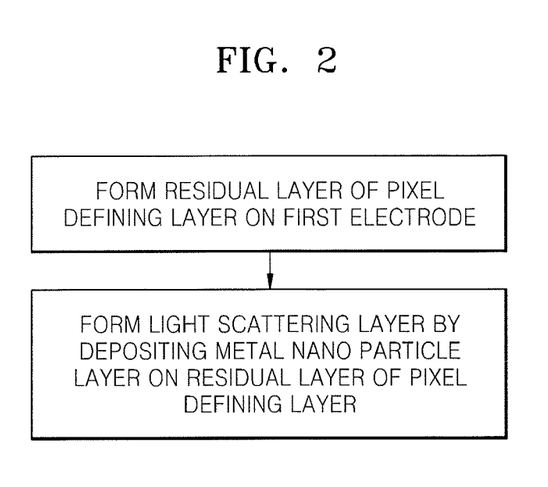
FIG. 2 illustrates a flowchart of a process of forming a light scattering layer of the organic light-emitting display device of FIG. 1.

FIG. 1 illustrates a cross-sectional view of an organic light-emitting display device 100 according to an embodiment. FIG. 2 illustrates a flowchart of a process of forming a light scattering layer 120 of FIG. 1.

Referring to FIGS. 1 and 2, a substrate 101 may be arranged in the organic light-emitting display device 100. The substrate 101 may include, e.g., a glass substrate or a plastic substrate formed of materials including polyethylene terephthalate (PET), polyethylene naphthalate (PEN), polyimide (PI), or the like.

If the organic light-emitting display device 100 is a bottom emission type organic light-emitting display device (in which an image is realized toward the substrate 101), the substrate 101 may be formed of a transparent material. On the other hand, if the organic light-emitting display device 100 is a top emission type organic light-emitting display device (in which an image is realized away from the substrate 101), the substrate 101 may not have to be formed of a transparent material. For example, the substrate 101 may be formed of a metal material or other non-transparent material.

When the substrate 101 is formed of a metal material or other non-transparent material, the substrate 101 may include, e.g., at least one selected from the group of carbon, iron, chromium, manganese, nickel, titanium, molybdenum, stainless steel (SUS), Invar alloys, Inconel alloys, and Kovar alloys. In an implementation, the substrate 101 may also be formed of a metal foil.

A buffer layer 102 may be formed on the substrate 101. The buffer layer 102 may form a planar surface on the substrate 101 and may help prevent moisture or foreign substances from penetrating into the substrate 101. The buffer layer 102 may be formed of, e.g., $SiO_2$, $SiN_x$, or the like. The buffer layer 102 may be deposited by a deposition method including, e.g., a plasma enhanced chemical vapor deposition (PECVD) method, an atmospheric pressure CVD (APCVD) method, a low pressure CVD (LPCVD) method, or the like.

A semiconductor active layer 106 may be patterned on the buffer layer 102. In a case where the semiconductor active layer 106 is formed of polysilicon, amorphous silicon may be formed and then may be crystallized to become polysilicon.

In order to crystallize amorphous silicon, a method including, e.g., a rapid thermal annealing (RTA) method, a solid phase crystallization (SPC) method, an excimer laser annealing (ELA) method, a metal induced crystallization (MIC) method, a metal induced lateral crystallization (MILC) method, a sequential lateral solidification (SLS) method, or the like, may be used.

A source region 107 and a drain region 108 may be formed in the semiconductor active layer 106 by being doped with an N-type impurity or a P-type impurity. A region between the source region 107 and the drain region 108 may be a channel region 124 that is not doped with an impurity.

A first insulating layer 103 may be formed on the semiconductor active layer 106. The first insulating layer 103 may have, e.g., a single-layer structure including $SiO_2$ or a double-layer structure including $SiO_2$ and $SiN_x$.

A gate electrode 119 may be formed on a predetermined region of the first insulating layer 103. The gate electrode 119 may include a first conductive layer 112 and a second conductive layer 113 on the first conductive layer 112. For example, the gate electrode 119 may include the first conductive layer 112 including a transparent conductive material, and the second conductive layer 113 including a metal material.

The first conductive layer 112 may be formed on the first insulating layer 103. The first conductive layer 112 may help improve adhesion between the first insulating layer 103 and the second conductive layer 113. The first conductive layer 112 may include, e.g., at least one material selected from the group of indium tin oxide (ITO), indium zinc oxide (IZO), zinc oxide (ZnO), indium oxide ($In_2O_3$), indium gallium oxide (IGO), and aluminum zinc oxide (AZO).

The second conductive layer 113 may be formed on the first conductive layer 112 and may function as a line for delivering an electrical signal. The second conductive layer 113 may have a single-layer or multiple-layer structure including at least one metal material selected from the group of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

For example, the second conductive layer 113 may include a first layer 113a formed of Mo, a second layer 113b on the first layer 113a and formed of Al, and a third layer 113c on the second layer 113b and formed of Mo. When the second conductive layer 113 has a Mo/Al/Mo structure, Al may function a line or an electrode, and Mo may function a barrier layer.

A capacitor 114 may be formed and may be separate from the semiconductor active layer 106. The capacitor 114 may include a capacitor lower electrode 115 and a capacitor upper electrode 116.

The capacitor lower electrode 115 may be formed on the buffer layer 102. For example, the capacitor lower electrode 115 may be formed on the same layer as the semiconductor active layer 106. The capacitor lower electrode 115 may be formed of, e.g., an inorganic semiconductor such as amorphous silicon or polysilicon, or an organic semiconductor.

The capacitor upper electrode 116 may be formed on the first insulating layer 103. The capacitor upper electrode 116 may be formed at a position that vertically corresponds to the capacitor lower electrode 115, and maybe formed on a same layer as the gate electrode 119. The capacitor upper electrode 116 may be insulated from the capacitor lower electrode 115 by having the first insulating layer 103 interposed therebetween.

The capacitor upper electrode 116 may be formed of a same material and may have a same structure as that of the first conductive layer 112 of the gate electrode 119. Thus, the capacitor upper electrode 116 may correspond to the first conductive layer 112 and may include a transparent conductive material.

As described above, the capacitor lower electrode 115 may be formed on the same layer as the semiconductor active layer 106, and the capacitor upper electrode 116 may be formed on the same layer as the gate electrode 119, so that a thickness of the organic light-emitting display device 100 may be efficiently decreased.

Furthermore, a pixel electrode 109 may be formed on a same layer as the gate electrode 119. For example, the pixel electrode 109 may be formed on the first insulating layer 103 and may be separate from the gate electrode 119. The pixel electrode 109 may include a first electrode 110 and a second electrode 111 on the first electrode 110.

The first electrode 110 may be formed on a same layer as the first conductive layer 112 of the gate electrode 119. The first electrode 110 and an opposite electrode 118 (described in greater detail below) may supply electricity to an organic layer 123. The first electrode 110 may include, e.g., at least one material selected from the group of indium tin oxide (ITO), indium zinc oxide (IZO), zinc oxide (ZnO), indium oxide ($In_2O_3$), indium gallium oxide (IGO), and aluminum zinc oxide (AZO).

The second electrode 111 may be formed on a same layer as the second conductive layer 113 of the gate electrode 119. The second electrode 111 may have a single-layer or multiple-layer structure including at least one metal material selected from the group of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

For example, the second electrode 111 may include a first layer 111a formed of Mo, a second layer 111b on the first layer 111a and formed of Al, and a third layer 111c on the second layer 111b and formed of Mo.

The second electrode 111 may include a first opening h1 for exposing a portion of the first electrode 110. The second electrode 111 may be electrically connected to one of the source and drain electrodes 117 (described in greater detail below) and may transmit an electrical signal from a thin film transistor (TFT) to the pixel electrode 109.

A second insulating layer 104 may be formed on the gate electrode 119 and the pixel electrode 109. The second insulating layer 104 may planarize a top surface of a TFT region including the gate electrode 119 and a top surface of a region including the pixel electrode 109, and may insulate the gate electrode 119 from the source and drain electrodes 117.

The second insulating layer 104 may be formed of various insulating materials. For example, the second insulating layer 104 may include an inorganic material such as an oxide or a nitride, or an organic material. In an implementation, the second insulating layer 104 may include an inorganic insulating layer, e.g., $SiO_2$, $SiN_x$, SiON, $Al_2O_3$, $TiO_2$, $Ta_2O_5$, $HfO_2$, $ZrO_2$, BST, PZT, or the like, or may an organic insulating layer, e.g., polymer derivatives having commercial polymers (PMMA and PS) and a phenol group, an acryl-based polymer, an imide-based polymer, an allyl ether-based polymer, an amide-based polymer, a fluorine-based polymer, a p-xylene-based polymer, a vinylalcohol-based polymer, or a combination thereof. The second insulating layer 104 may be formed as a multi-stack including the inorganic insulating layer and the organic insulating layer. The second insulating layer 104 may be formed by using, e.g., a spin coating method or the like.

The second insulating layer 104 may include a second opening h2 that corresponds to the first opening h1. The first opening h1 may be exposed via the second opening h2. In an implementation, the second insulating layer 104 may include contact holes for exposing the source region 107 and the drain region 108 of the semiconductor active layer 106.

The source and drain electrodes 117 may respectively contact the source region 107 and the drain region 108 of the semiconductor active layer 106 via the contact holes. In an implementation, one of the source and drain electrodes 117 may be electrically connected to the second electrode 111 of the pixel electrode 109.

The source and drain electrodes 117 may be formed by patterning a metal layer. The metal layer may have a multiple-layer structure. For example, the source and drain electrodes 117 may have a single-layer or multiple-layer structure including at least one metal material selected from the group of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

A pixel defining layer (PDL) 105 may be formed on the source and drain electrodes 117. The PDL 105 may be formed of an organic material or an inorganic material. The PDL 105 may include a third opening h3. The third opening h3 may contact the first opening h1 and the second opening h2 or may be formed in the first opening h1 and the second opening h2. The first electrode 110 of the pixel electrode 109 may be exposed via the third opening h3.

The organic layer 123 may contact the first electrode 110 of the pixel electrode 109 which is exposed via the first electrode 110. The organic layer 123 may emit light by being electrically driven by the pixel electrode 109 and the opposite electrode 118.

An emission layer (EML) of the organic layer 123 may be formed of a low molecular weight organic material or a polymer organic material.

When the organic layer 123 is formed of a low molecular weight organic material, the organic layer 123 may have a structure in which a hole injection layer (HIL), a hole transport layer (HTL), an EML, an electron transport layer (ETL), an electron injection layer (EIL), or the like are singularly or multiply stacked, and may be formed by using one of various organic materials including copper phthalocyanine (CuPc), N,N'-Di(naphthalene-1-yl)-N,N'-diphenyl-benzidine (NPB), tris-8-hydroxyquinoline aluminum)($Alq_3$), or the like.

When the organic layer 123 is formed of a polymer organic material, the organic layer 123 may include an HTL and an EML. The HTL may be formed of PEDOT, and the EML may be formed of a poly-phenylenevinylene-based polymer organic material or a polyfluorene-based polymer organic material.

A type of the organic layer 123 is not limited thereto and thus various examples may be applied thereto. In an implementation, the organic layer 123 may be formed on the pixel electrode 109 by using, e.g., an inkjet printing method, a spin coating method, or the like.

The opposite electrode 118 may be formed on the organic layer 123. The opposite electrode 118 may face the pixel electrode 109 by having the organic layer 123 interposed therebetween. The opposite electrode 118 may be formed by depositing a small work function metal material including, e.g., silver (Ag), magnesium (Mg), aluminum (Al), platinum (Pt), lead (Pb), gold (Au), nickel (Ni), neodymium (Nd), iridium (Ir), chromium (Cr), lithium (Li), calcium (Ca), or a compound of any of these, and then by depositing a transparent conductive material thereon. For example, the transparent conductive material may include ITO, IZO, ZnO, $In_2O_3$, or the like.

An encapsulation member (not shown) may be further formed on the opposite electrode 118. The encapsulation member may help protect the organic layer 123 and other layers against moisture or oxygen from the outside, and may be formed of a transparent material. For example, the encapsulation member may include a plastic material or may have a composite-layer structure including an organic material and an inorganic material.

When some types of organic light-emitting display devices emit light, only 20% of the light is externally emitted, and 80% of the light may be lost internally. According to an embodiment, the light scattering layer 120 may be formed in a pixel region so as to improve luminescent efficiency.

The light scattering layer 120 may be formed between the organic layer 123 and the first electrode 110 of the pixel electrode 109. The light scattering layer 120 may include particles 121 and a conductive layer 122 covering the particles 121.

When the PDL 105 is patterned, the PDL 105 may not only be formed in a desired region. For example, a residual layer (e.g., remnants of material that remain after forming the PDL 105) having a thickness equal to or less than several tens of Å may remain in another region, e.g., on a surface of the first electrode 110. A minute scattering structure may be achieved by not removing the particles 121, e.g., the residual layer, and by performing surface modification on the particles 121.

In order to cover the particles 121, the conductive layer 122 may be formed on the surface of the first electrode 110 externally exposed via the third opening h3. The conductive layer 122 may be formed of a metal nano ink, e.g., an ITO nano ink, a silver nano ink, a nickel nano ink, or the like.

The conductive layer 122 may be formed by using, e.g., a coating method such as a slit coating method or a spin coating method, or by using a printing method such as an inkjet printing method or a nozzle printing method. When the conductive layer 122 is printed, a temperature of a base plate on which the organic light-emitting display device 100 is mounted may remain at about 30° C.

In an implementation, when the conductive layer 122 is printed, portions thereof overlying the particles 121 may bulge at a surface of the conductive layer 122 due to existence of the particles 121 (compared to portions in which the particles 121 are not formed). In this manner, protrusions 122a having a bulged micro-lens shape may be formed on a surface of the conductive layer 122. For example, the protrusions 122a may vertically correspond to or may be vertically aligned with the particles 121.

After the printing operation, a baking process may be performed at about 80° C., and then a sintering process may be performed, so that the light scattering layer 120 may be formed.

As described above, the light scattering layer 120 may be formed in a manner such that the conductive layer 122 has the protrusions 122a that have the bulged micro-lens shape and that correspond to or are vertically aligned with the particles 121 (e.g., residual portions of the PDL 105). For example, the residual layer may remain on the surface of the first electrode 110 when the PDL 105 is formed, so that the light scattering layer 120 may scatter light generated in the organic layer 123. Accordingly, outdoor visibility and a luminescent efficiency with respect to all wavelength bands may be improved in the organic light-emitting display device 100.

Figure 3:
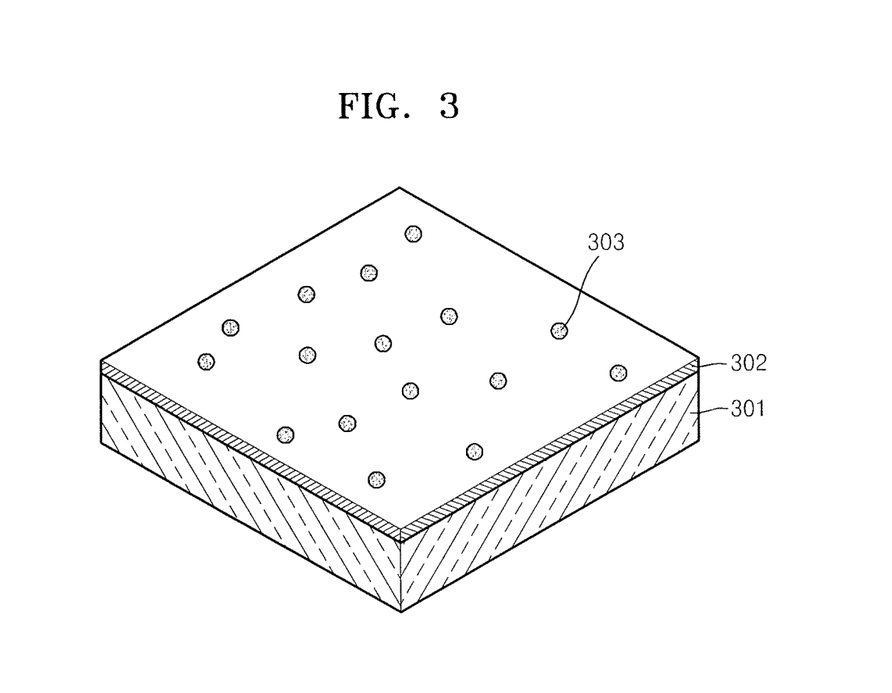
FIG. 3 illustrates a perspective view of a stage in which a light scattering layer is formed, according to an embodiment.
Figure 4:
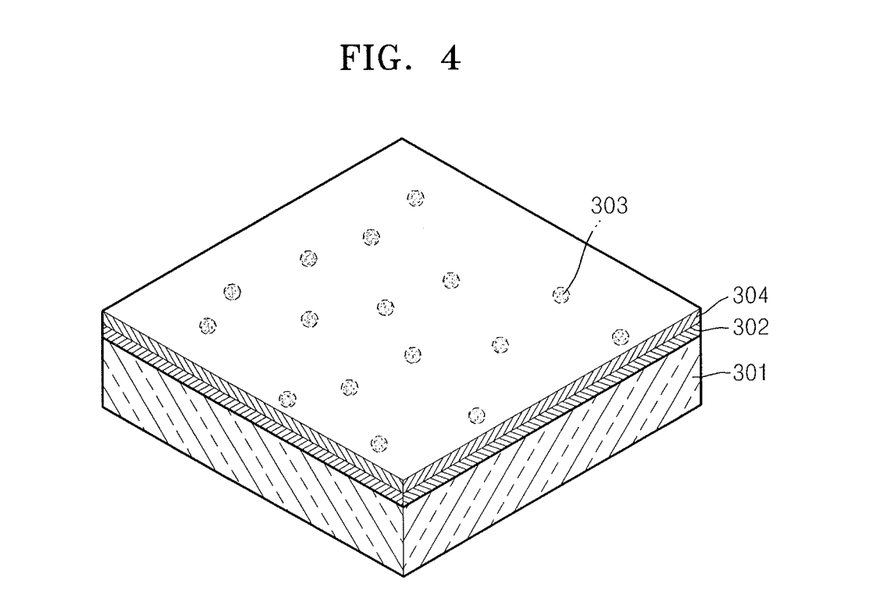
FIG. 4 illustrates a perspective view of a stage in a method in which a planarization layer is formed on the light scattering layer of FIG. 3.
Figure 5:
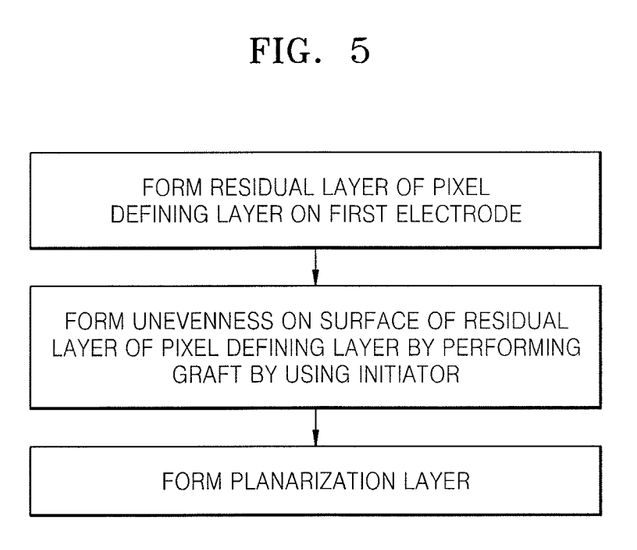
FIG. 5 illustrates a flowchart of a process of forming the light scattering layer of FIG. 3.

FIG. 3 illustrates a perspective view of a stage in which a light scattering layer is formed, according to an embodiment. FIG. 4 illustrates a perspective view of a stage in a method in which a planarization layer is formed on the light scattering layer of FIG. 3. FIG. 5 illustrates a flowchart of a process of forming the light scattering layer of FIG. 3.

Here, only elements of the organic light-emitting display device 100 of FIG. 1 which are related to the light scattering layer are described, and descriptions regarding the other elements may be omitted.

Referring to FIGS. 3 through 5, a first electrode 302 may be formed on the substrate 301. The first electrode 302 may correspond to the first electrode 110 of the pixel electrode 109 of FIG. 1.

The first electrode 302 may include at least one material selected from the group of indium tin oxide (ITO), indium zinc oxide (IZO), zinc oxide (ZnO), indium oxide ($In_2O_3$), indium gallium oxide (IGO), and aluminum zinc oxide (AZO).

The particles 303 may be formed on the first electrode 302. The particles 303 may correspond to a residual layer of a PDL (refer to the PDL 105 of FIG. 1) which remains on a surface of the first electrode 302 when the PDL (that exposes portions of the first electrode 302 and simultaneously covers the first electrode 302) is formed. A size of each particle 303 may be equal to or less than several tens of Å.

In an implementation, the PDL 105 may not be in a polymer state but rather may be in an oligomer state. Thus, the particles 303 may have a minute uneven structure via a graft polymerization process using an initiator such as imidazole.

In an implementation, the particles 303 may be formed of a polymer material, e.g., polyimide. Thus, the particles 303 may have low adhesion with respect to a metal material and the particles 303 may be graft-polymerized. Via the graft polymerization, a surface of each particle 303 may be modified, so that the particles 303 may have unevenness that is equal to or greater than 100 Å. The particles 303 may perform a function of the light scattering layer.

After the particles 303 (having the unevenness of a nano structure) are formed, the planarization layer 304 may formed to cover the particles 303. Surface roughness may adversely affect an efficiency of an organic light-emitting display device. Thus, the planarization layer 304 may be formed on the particles 303 so as to make planarization on the particles 303.

Figure 6:
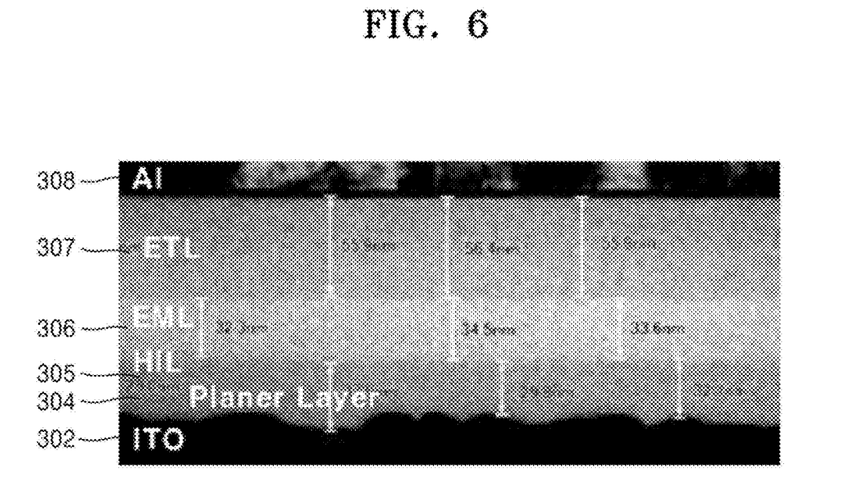
FIG. 6 illustrates an image in which the planarization layer of FIG. 4 is formed.

For example, referring to FIG. 6, an organic layer including an HIL 305, an EML 306, and an ETL 307 may be formed on the first electrode 302, and an opposite electrode 308 may be formed on the organic layer.

In an implementation, the planarization layer 304 may be interposed between the first electrode 302 and the HIL 305. The planarization layer 304 may include a siloxane-based compound (O—Si—O). The planarization layer 304 may help maintain surface roughness on the first electrode 302 at a level equal to or less than 0.5 nm, when the particles 303 having unevenness are formed on the first electrode 302. Thus, it is possible to maintain an electrical characteristic of the HIL 305 at the same level.

As described above, the particles 303 having minute unevenness may be formed by graft-polymerizing the residual layer of the PDL 105. Thus, the particles 303 may perform a function of the light scattering layer.

Figure 7:
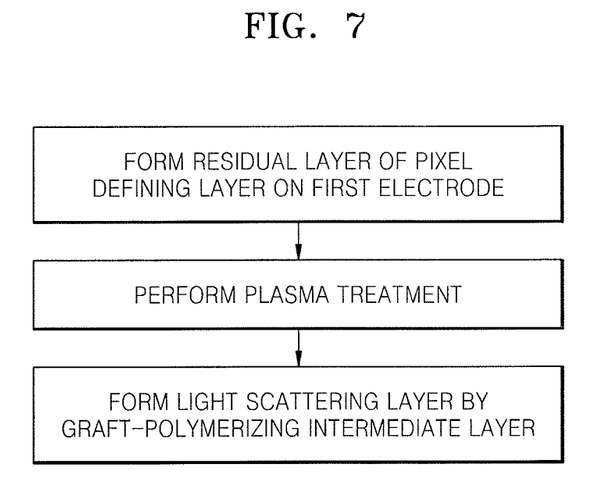
FIG. 7 illustrates a flowchart of a process of forming a light scattering layer, according to an embodiment.

FIG. 7 illustrates a flowchart of a process of forming a light scattering layer, according to an embodiment.

The present embodiment is similar to the previous embodiments in that the light scattering layer is formed by using the residual layer of the PDL 105 and then by performing a thermal treatment at a desired temperature. Thus, features of the present embodiment (of FIG. 7) will be described.

Referring to FIG. 7, particles may be formed on a first electrode (e.g., a pixel electrode). In this regard, the particles may correspond to a residual layer that remains on the first electrode when a PDL is formed.

Afterward, before an organic layer is deposited, a surface treatment may be performed on the first electrode on which the particles are formed. The surface treatment may include, e.g., an argon plasma treatment. For example, when the surface treatment is performed on the first electrode (on which the particles have been formed), adhesion may be increased via the argon plasma treatment. Thus, the argon plasma treatment may be performed prior to the graft polymerization.

After the argon plasma treatment is performed, selectively, a light scattering layer having an unevenness structure may be formed by graft-polymerizing an intermediate layer, i.e., particles that may react well with the first electrode, by using an initiator such as imidazole. In an implementation, the intermediate layer (that is formed of the particles and that is the residual layer of the PDL) may include a polyimide component obtained by polymerizing polyamic acid. The polyimide component may be a recombination of an outgassed component when polyimide is cured in an oven at a high temperature under a $N_2$ atmosphere. In an implementation, the intermediate layer may not be 100% polyimide but may have an intermediate compound in an oligomer state that is an intermediate state of polymer.

Figure 8:
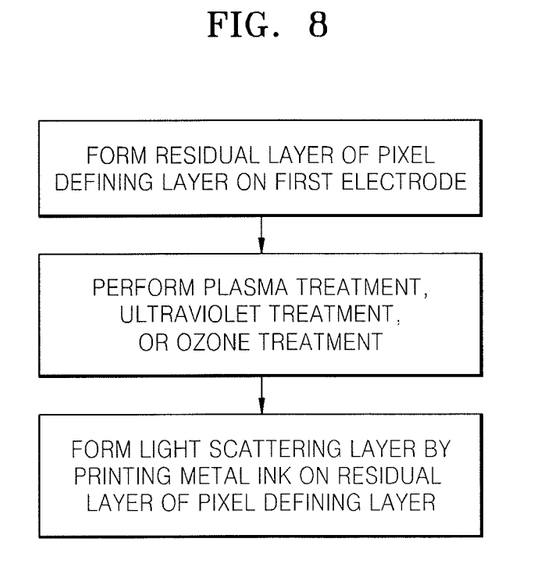
FIG. 8 illustrates a flowchart of a process of forming a light scattering layer, according to an embodiment.

FIG. 8 illustrates a flowchart of a process of forming a light scattering layer, according to an embodiment.

The present embodiment may be similar to the previous embodiments in that the light scattering layer is formed by using the residual layer of the PDL 105 and then by performing a thermal treatment at a desired temperature. Thus, the features of the present embodiment (of FIG. 8) will be described.

Referring to FIG. 8, particles may be formed on a first electrode. The particles may correspond to a residual layer of a PDL that remains on an exposed surface of the first electrode, when the PDL is patterned to cover the first electrode (e.g., except for exposed portions of the first electrode).

Then, before an organic layer is deposited on the first electrode, a surface treatment may be performed on the first electrode. In an implementation, the surface treatment may include a plasma treatment, an ultraviolet treatment, or an ozone treatment. In an implementation, an argon plasma treatment may be performed on the particles that remain on the first electrode with only a very small amount. Via the argon plasma treatment, adhesion between the particles and a conductive layer covering the particles may be improved.

Afterward, the conductive layer (including a metal nano ink such as an ITO nano ink, a silver nano ink, a nickel nano-ink, or the like) may be formed on the first electrode. In an implementation, the conductive layer may be formed by using a printing method such as an inkjet printing method.

Accordingly, protrusions having a bulged micro-lens shape may be formed on a surface of the conductive layer. For example, the protrusions may vertically correspond to or may be vertically aligned with the particles, so that the particles may perform a function of the light scattering layer.

By way of summation and review, it may be difficult to obtain highly efficient emission via a stack structure. Thus, intermediate layers such as an electron injection layer (EIL), an electron transport layer (ETL), a hole transport layer (HTL), a hole injection layer (HIL), and the like may be selectively inserted therebetween. In an organic light-emitting display device, only 20% of light generated in the EML may be externally emitted, and 80% of the light may be lost internally. Thus, it may be desirable for the organic light-emitting display device to have a structure having an improved luminescent efficiency.

As described above, according to an embodiment, outdoor visibility and a luminescent efficiency with respect to all wavelength bands may be improved in the organic light-emitting display device.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An organic light-emitting display device, comprising:
a thin film transistor (TFT) on a substrate;
an organic light emitting diode (OLED) electrically connected to the TFT, the OLED including a pixel electrode, an organic layer, and an opposite electrode;
a pixel defining layer (PDL) on the pixel electrode, the PDL including an opening that exposes at least one portion of the pixel electrode; and
a light scattering layer on the pixel electrode and under the organic layer, wherein the light scattering layer includes:
particles on a surface of the pixel electrode in the opening of the PDL, and
a conductive layer, the conductive layer covering and directly contacting the particles and having an unevenness, and the particles including remnants of material that remain after forming the PDL,
wherein the light scattering layer is positioned between the pixel electrode and the organic layer, preventing the pixel electrode and the organic layer from contacting each other along their entire lengths, and the lateral boundaries of the organic layer, the lateral boundaries of the PDL, or both, extend beyond the lateral boundaries of the light scattering layer.

2. The organic light-emitting display device of claim 1, wherein protrusions having a bulged micro-lens shape are on a surface of the conductive layer, the protrusions vertically corresponding to the particles.

3. The organic light-emitting display device of claim 1, wherein the conductive layer is formed of a metal nano ink.

4. The organic light-emitting display device of claim 1, wherein the conductive layer covers the particles by using a coating method or a printing method.

5. The organic light-emitting display device of claim 1, wherein a plasma treatment, an ultraviolet treatment, or an ozone treatment is performed on the surface of the pixel electrode on which the particles are arrayed.

6. The organic light-emitting display device of claim 1, wherein the particles have an unevenness formed via a graft polymerization.

7. The organic light-emitting display device of claim 6, wherein the particles are covered by a planarization layer.

8. The organic light-emitting display device of claim 1, wherein the particles have an unevenness formed by graft-polymerizing an intermediate layer.

9. The organic light-emitting display device of claim 8, wherein a surface treatment is performed on the surface of the pixel electrode on which the particles are arrayed.

10. The organic light-emitting display device of claim 8, wherein the intermediate layer includes a polyimide component obtained by polymerizing polyamic acid.

11. The organic light-emitting display device of claim 1, wherein:

the TFT includes a semiconductor active layer, a gate electrode, source and drain electrodes, and a plurality of insulating layers interposed therebetween, and the pixel electrode is electrically connected to one of the source and drain electrodes.

12. The organic light-emitting display device of claim 1, wherein the pixel electrode includes:

a first electrode including a transparent conductive material, and a second electrode on the first electrode and including a metal material.

13. The organic light-emitting display device of claim 12, wherein the first electrode includes at least one material selected from the group of indium tin oxide (ITO), indium zinc oxide (IZO), zinc oxide (ZnO), indium oxide $In_2O_3$, indium gallium oxide (IGO), and aluminum zinc oxide (AZO).

14. The organic light-emitting display device of claim 12, wherein:

the first electrode is externally exposed via the opening of the PDL, and the light scattering layer and the organic layer are stacked on the first electrode.

15. The organic light-emitting display device of claim 1, wherein the particles are formed of a material derived from a material that forms the PDL.

16. The organic light-emitting display device of claim 1, wherein the lateral boundaries of the PDL extend beyond the lateral boundaries of the light scattering layer.

17. The organic light-emitting display device of claim 1, wherein the lateral boundaries of both the organic layer and the PDL extend beyond the lateral boundaries of the light scattering layer.

* * * * *